United States Patent
Boardman et al.

(10) Patent No.: US 7,427,523 B2
(45) Date of Patent: Sep. 23, 2008

(54) METHOD OF MAKING LIGHT EMITTING DEVICE WITH SILICON-CONTAINING ENCAPSULANT

(75) Inventors: Larry D. Boardman, Woodbury, MN (US); D. Scott Thompson, Woodbury, MN (US); Catherine A. Leatherdale, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 311 days.

(21) Appl. No.: 11/383,885

(22) Filed: May 17, 2006

(65) Prior Publication Data

US 2006/0199291 A1      Sep. 7, 2006

Related U.S. Application Data

(63) Continuation of application No. 10/993,460, filed on Nov. 18, 2004, now Pat. No. 7,192,795.

(51) Int. Cl.
*H01L 21/00* (2006.01)

(52) U.S. Cl. ............... 438/22; 438/61; 438/124; 257/79; 257/82

(58) Field of Classification Search ............ 438/22, 438/26, 61, 63, 64, 118, 124; 257/79, 82, 257/103
See application file for complete search history.

(56) References Cited

U.S. PATENT DOCUMENTS

| | | | |
|---|---|---|---|
| 2,823,218 A | 2/1958 | Speier et al. |
| 3,159,662 A | 12/1964 | Ashby |
| 3,220,972 A | 11/1965 | Lamoreaux |
| 3,410,886 A | 11/1968 | Joy |
| 3,419,593 A | 12/1968 | Willing |
| 3,445,420 A | 5/1969 | Kookootsedes et al. |
| 3,715,334 A | 2/1973 | Karstedt |
| 3,814,730 A | 6/1974 | Karstedt |
| 3,933,880 A | 1/1976 | Bergstrom et al. |
| 3,989,666 A | 11/1976 | Niemi |
| 3,989,667 A | 11/1976 | Lee et al. |
| 4,256,870 A | 3/1981 | Eckberg |
| 4,347,346 A | 8/1982 | Eckberg |
| 4,421,903 A | 12/1983 | Ashby |
| 4,435,259 A | 3/1984 | Chang |
| 4,504,645 A | 3/1985 | Melancon |
| 4,510,094 A | 4/1985 | Drahnak |
| 4,530,879 A | 7/1985 | Drahnak |
| 4,585,669 A | 4/1986 | Eckberg |

(Continued)

FOREIGN PATENT DOCUMENTS

EP         398573         11/1990

(Continued)

*Primary Examiner*—Phuc T Dang
(74) *Attorney, Agent, or Firm*—Elizabeth A. Gallo

(57) ABSTRACT

A method of making a light emitting device is disclosed. The method includes providing a light emitting diode and forming an encapsulant in contact with the light emitting diode; wherein forming the encapsulant includes contacting the light emitting diode with a photopolymerizable composition comprising a silicon-containing resin, a metal-containing catalyst, and surface treated particles, the silicon-containing resin comprises silicon-bonded hydrogen and aliphatic unsaturation, the surface treated particles comprising nonabsorbing metal oxide particles, semiconductor particles, or combinations thereof, and applying actinic radiation having a wavelength of 700 nm or less to initiate hydrosilylation within the silicon-containing resin.

18 Claims, 1 Drawing Sheet

U.S. PATENT DOCUMENTS

| | | |
|---|---|---|
| 4,587,137 A | 5/1986 | Eckberg |
| 4,600,484 A | 7/1986 | Drahnak |
| 4,603,215 A | 7/1986 | Chandra et al. |
| 4,609,574 A | 9/1986 | Keryk et al. |
| 4,670,531 A | 6/1987 | Eckberg |
| 4,705,765 A | 11/1987 | Lewis |
| 4,774,111 A | 9/1988 | Lo |
| 4,916,169 A | 4/1990 | Boardman et al. |
| RE33,289 E | 8/1990 | Modic |
| 5,063,102 A | 11/1991 | Lee et al. |
| 5,122,943 A | 6/1992 | Pugh |
| 5,145,886 A | 9/1992 | Oxman et al. |
| 5,213,864 A | 5/1993 | Wong |
| 5,310,581 A | 5/1994 | Schmidt et al. |
| 5,313,365 A | 5/1994 | Pennisi et al. |
| 5,403,773 A | 4/1995 | Nitta et al. |
| 5,496,961 A | 3/1996 | Dauth et al. |
| 5,523,436 A | 6/1996 | Dauth et al. |
| 5,525,564 A | 6/1996 | McAfee et al. |
| 5,639,845 A | 6/1997 | Inomata et al. |
| 5,777,433 A | 7/1998 | Lester et al. |
| 5,895,228 A | 4/1999 | Biebuyck et al. |
| 5,952,397 A | 9/1999 | Fujiki et al. |
| 6,046,250 A | 4/2000 | Boardman et al. |
| 6,099,783 A | 8/2000 | Scranton et al. |
| 6,114,090 A | 9/2000 | Wu et al. |
| 6,150,546 A | 11/2000 | Butts |
| 6,319,425 B1 | 11/2001 | Tasaki et al. |
| 6,376,569 B1 | 4/2002 | Oxman et al. |
| 6,451,869 B1 | 9/2002 | Butts |
| 6,544,499 B1 * | 4/2003 | Glenn et al. .............. 424/70.1 |
| 6,600,175 B1 | 7/2003 | Baretz et al. |
| 6,653,157 B2 | 11/2003 | Kondo |
| 6,664,318 B1 | 12/2003 | Bymark et al. |
| 6,740,465 B2 | 5/2004 | Liang et al. |
| 6,756,731 B1 | 6/2004 | Sano |
| 6,806,509 B2 | 10/2004 | Yoshino et al. |
| 6,806,658 B2 | 10/2004 | Tan et al. |
| 6,921,929 B2 | 7/2005 | LeBoeuf et al. |
| 6,958,250 B2 | 10/2005 | Yang |
| 7,192,795 B2 | 3/2007 | Boardman et al. |
| 2002/0030194 A1 | 3/2002 | Camras et al. |
| 2002/0061451 A1 * | 5/2002 | Kita et al. .................... 430/2 |
| 2004/0053059 A1 | 3/2004 | Mistele |
| 2004/0116640 A1 | 6/2004 | Miyoshi |
| 2004/0145913 A1 | 7/2004 | Ouderkirk et al. |
| 2004/0150991 A1 | 8/2004 | Ouderkirk et al. |
| 2004/0245541 A1 | 12/2004 | Shitagaki et al. |
| 2005/0244649 A1 | 11/2005 | Kashiwagi |
| 2006/0035092 A1 | 2/2006 | Shimizu et al. |
| 2006/0157875 A1 | 7/2006 | Van Santen et al. |
| 2006/0186428 A1 | 8/2006 | Tan et al. |
| 2006/0226774 A1 | 10/2006 | Sofue et al. |
| 2007/0112147 A1 | 5/2007 | Morita et al. |
| 2007/0134425 A1 | 6/2007 | Morita et al. |

FOREIGN PATENT DOCUMENTS

| | | |
|---|---|---|
| EP | 1 198 016 | 4/2002 |
| JP | 2002 232018 | 8/2002 |
| KR | 2004 0086871 | 10/2004 |

* cited by examiner

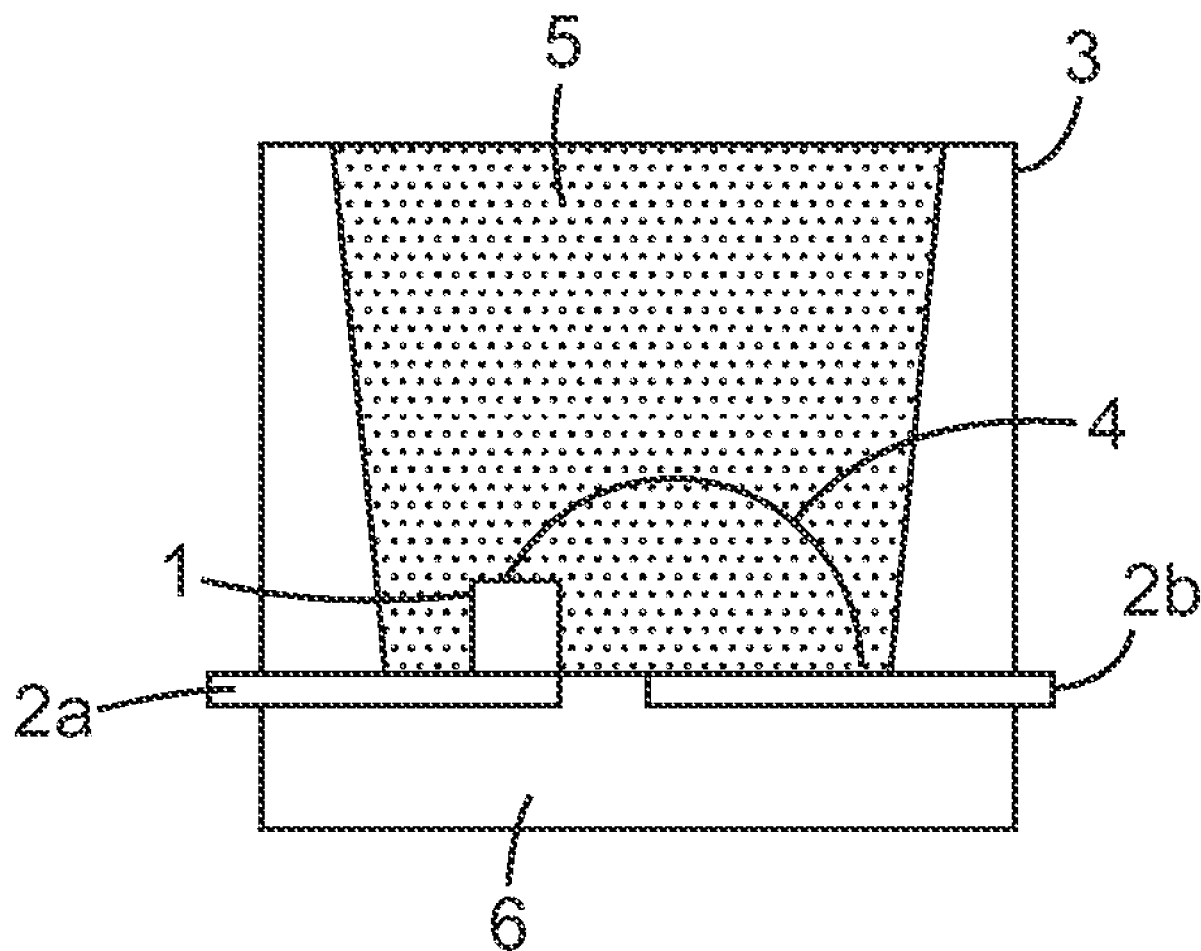

METHOD OF MAKING LIGHT EMITTING DEVICE WITH SILICON-CONTAINING ENCAPSULANT

CROSS REFERENCE TO RELATED APPLICATIONS

This application is a continuation of U.S. application Ser. No. 10/993,460, filed Nov. 18, 2004, now U.S. Pat. No. 7,192,795.

FIELD OF THE INVENTION

The invention relates to a method of making a light emitting device. More particularly, the invention relates to a method of making a light emitting device having a light emitting diode (LED) and a silicon-containing encapsulant.

BACKGROUND

Typical encapsulants for LEDs are organic polymeric materials. Encapsulant lifetime is a significant hurdle holding back improved performance of high brightness LEDs. Conventional LEDs are encapsulated in epoxy resins and, when is use, tend to yellow over time reducing the LED brightness and changing the color rendering index of the light emitted from the light emitting device. This is particularly important for white LEDs. The yellowing of the epoxy is believed to result from decomposition induced by the high operating temperatures of the LED and/or absorption of UV-blue light emitted by the LED.

A second problem that can occur when using conventional epoxy resins is stress-induced breakage of the wire bond on repeated thermal cycling. High brightness LEDs can have heat loads on the order of 100 Watts per square centimeter. Since the coefficients of thermal expansion of epoxy resins typically used as encapsulants are significantly larger than those of the semiconductor layers and the moduli of the epoxies can be high, the embedded wire bond can be stressed to the point of failure on repeated heating and cooling cycles.

Thus, there is a need for new photochemically stable and thermally stable encapsulants for LEDs that reduce the stress on the wire bond over many temperature cycles. In addition, there is a need for encapsulants with relatively rapid cure mechanisms in order to accelerate manufacturing times and reduce overall LED cost.

SUMMARY

A method of making a light emitting device is disclosed herein. The method includes providing a LED and forming an encapsulant in contact with the LED; wherein forming the encapsulant includes contacting the light emitting diode with a photopolymerizable composition comprising a silicon-containing resin, a metal-containing catalyst, and surface treated particles, the silicon-containing resin comprises silicon-bonded hydrogen and aliphatic unsaturation, the surface treated particles comprising nonabsorbing metal oxide particles, semiconductor particles, or combinations thereof, and applying actinic radiation having a wavelength of 700 nm or less to initiate hydrosilylation within the silicon-containing resin.

The method disclosed herein provides a LED with a silicon-containing encapsulant, wherein the silicon-containing encapsulant can have one or more of the following desirable features: high refractive index, photochemical stability, thermal stability, relatively rapid cure mechanisms, and are capable of being cured at relatively low temperatures.

These and other aspects of the invention will be apparent from the detailed description below. In no event, however, should the above summary be construed as a limitation on the claimed subject matter, which subject matter is defined solely by the attached claims, as may be amended during prosecution.

BRIEF DESCRIPTION OF THE DRAWING

The invention may be more completely understood in consideration of the following detailed description and examples in connection with the FIGURE described below. The FIGURE is an illustrative example and, in no event, should be construed as a limitation on the claimed subject matter, which subject matter is defined solely by the claims set forth herein.

The FIGURE is a schematic diagram of a light emitting device capable of being prepared according to the disclosed method.

DETAILED DESCRIPTION

A method of making a light emitting device is disclosed. Referring to the FIGURE, LED 1 is mounted on a metallized contact 2a disposed on a substrate 6 in a reflecting cup 3. LED 1 has one electrical contact on its lowermost surface and another on its uppermost surface, the latter of which is connected to a separate electrical contact 2b by a wire bond 4. A power source can be coupled to the electrical contacts to energize the LED. Encapsulant 5 encapsulates the LED.

A method for preparing a light emitting device with an LED sealed within a silicon-containing encapsulant is disclosed. Such silicon-containing resins are advantageous because of their thermal and photochemical stability. Silicon-containing encapsulants are known in the art. These compositions typically comprise organosiloxanes that are cured either by acid-catalyzed condensation reactions between silanol groups bonded to the organosiloxane components or by metal-catalyzed hydrosilylation reactions between groups incorporating aliphatic unsaturation and silicon-bonded hydrogen which are bonded to the organosiloxane components. In the first instance, the curing reaction is relatively slow, sometimes requiring many hours to proceed to completion. In the second instance, desirable levels of cure normally require temperatures significantly in excess of room temperature. For example, US Patent Application Publication US 2004/0116640 A1 states that such compositions are " . . . preferably cured by heating at about 120 to 180° C. for about 30 to 180 minutes."

The method disclosed herein also utilizes organosiloxane compositions that are cured by metal-catalyzed hydrosilylation reactions between groups incorporating aliphatic unsaturation and silicon-bonded hydrogen, which are bonded to the organosiloxane components. However, the metal-containing catalysts used herein can be activated by actinic radiation. The advantages of using radiation-activated hydrosilylation to cure the compositions of the invention include (1) the ability to cure the encapsulating composition without subjecting the LED, the substrate to which it is attached, or any other materials present in the package or system, to potentially harmful temperatures, (2) the ability to formulate one-part encapsulating compositions that display long working times (also known as bath life or shelf life), (3) the ability to cure the encapsulating formulation on demand at the discretion of the user, and (4) the ability to simplify the formulation process by avoiding the need for two-part formulations as is typically required for thermally curable hydrosilylation compositions.

The disclosed method involves the use of actinic radiation having a wavelength of less than or equal to 700 nanometers (nm). Thus, the disclosed methods are particularly advantageous to the extent they avoid harmful temperatures. Preferably, the disclosed methods involve the application of actinic radiation at a temperature of less than 120° C., more preferably, at a temperature of less than 60° C., and still more preferably at a temperature of 25° C. or less.

Actinic radiation used in the disclosed methods includes light of a wide range of wavelengths less than or equal to 700 nm, including visible and UV light, but preferably, the actinic radiation has a wavelength of of 600 nm or less, and more preferably from 200 to 600 nm., and even more preferably, from 250 to 500 nm. Preferably, the actinic radiation has a wavelength of at least 200 nm, and more preferably at least 250 nm.

A sufficient amount of actinic radiation is applied to the silicon-containing resin for a time to form an at least partially cured encapsulant. A partially cured encapsulant means that at least 5 mole percent of the aliphatic unsaturation is consumed in a hydrosilylation reaction. Preferably, a sufficient amount of the actinic radiation is applied to the silicon-containing resin for a time to form a substantially cured encapsulant. A substantially cured encapsulant means that greater than 60 mole percent of the aliphatic unsaturation present in the reactant species prior to reaction has been consumed as a result of the light activated addition reaction of the silicon-bonded hydrogen with the aliphatic unsaturated species. Preferably, such curing occurs in less than 30 minutes, more preferably in less than 10 minutes, and even more preferably in less than 5 minutes. In certain embodiments, such curing can occur in seconds.

Examples of sources of actinic radiation include those of a very wide range. These include tungsten halogen lamps, xenon arc lamps, mercury arc lamps, incandescent lamps, and fluorescent lamps. In certain embodiments, the source of actinic radiation is the LED.

The silicon-containing resin can include monomers, oligomers, polymers, or mixtures thereof. It includes silicon-bonded hydrogen and aliphatic unsaturation, which allows for hydrosilylation (i.e., the addition of a silicon-bonded hydrogen across a carbon-carbon double bond or triple bond). The silicon-bonded hydrogen and the aliphatic unsaturation may or may not be present in the same molecule. Furthermore, the aliphatic unsaturation may or may not be directly bonded to silicon.

Preferred silicon-containing resins are those that provide an encapsulant which can be in the form of a liquid, gel, elastomer, or a non-elastic solid, and are thermally and photochemically stable. For UV light, silicon-containing resins having refractive indices of at least 1.34 are preferred. For some embodiments, silicon-containing resins having refractive indices of at least 1.50 are preferred.

Preferred silicon-containing resins are selected such that they provide an encapsulant that is photostable and thermally stable. Herein, photostable refers to a material that does not chemically degrade upon prolonged exposure to actinic radiation, particularly with respect to the formation of colored or light absorbing degradation products. Herein, thermally stable refers to a material that does not chemically degrade upon prolonged exposure to heat, particularly with respect to the formation of colored or light absorbing degradation products. In addition, preferred silicon-containing resins are those that possess relatively rapid cure mechanisms (e.g., seconds to less than 30 minutes) in order to accelerate manufacturing times and reduce overall LED cost.

Examples of suitable silicon-containing resins are disclosed, for example, in U.S. Pat. No. 6,376,569 (Oxman et al.), U.S. Pat No. 4,916,169 (Boardman et al.), U.S. Pat No. 6,046,250 (Boardman et al.), U.S. Pat No. 5,145,886 (Oxman et al.), U.S. Pat No. U.S. Pat. No. 6,150,546 (Butts), and in U.S. Pat. Appl. No. 2004/0116640 (Miyoshi). A preferred silicon-containing resin comprises an organosiloxane (i.e., silicones) which includes organopolysiloxanes. Such resins typically include at least two components, one having silicon-bonded hydrogen and one having aliphatic unsaturation. However, both silicon-bonded hydrogen and olefinic unsaturation may exist within the same molecule.

In one embodiment, the silicon-containing resin can include a silicone component having at least two sites of aliphatic unsaturation (e.g., alkenyl or alkynyl groups) bonded to silicon atoms in a molecule and an organohydrogensilane and/or organohydrogenpolysiloxane component having at least two hydrogen atoms bonded to silicon atoms in a molecule. Preferably, a silicon-containing resin includes both components, with the silicone containing aliphatic unsaturation as the base polymer (i.e., the major organosiloxane component in the composition.) Preferred silicon-containing resins are organopolysiloxanes. Such resins typically comprise at least two components, at least one of which contains aliphatic unsaturation and at least one of which contains silicon-bonded hydrogen. Such organopolysiloxanes are known in the art and are disclosed in such patents as U.S. Pat. No. 3,159,662 (Ashby), U.S. Pat. No. 3,220,972 (Lamoreauz), U.S. Pat. No. 3,410,886 (Joy), U.S. Pat. No. 4,609,574 (Keryk), U.S. Pat. No. 5,145,886 (Oxman, et. al), and U.S. Pat. No. 4,916,169 (Boardman et. al). Curable one component organopolysiloxane resins are possible if the single resin component contains both aliphatic unsaturation and silicon-bonded hydrogen.

Organopolysiloxanes that contain aliphatic unsaturation are preferably linear, cyclic, or branched organopolysiloxanes comprising units of the formula $R^1_a R^2_b SiO_{(4-a-b)/2}$ wherein: $R^1$ is a monovalent, straight-chained, branched or cyclic, unsubstituted or substituted hydrocarbon group that is free of aliphatic unsaturation and has from 1 to 18 carbon atoms; $R^2$ is a monovalent hydrocarbon group having aliphatic unsaturation and from 2 to 10 carbon atoms; a is 0, 1, 2, or 3; b is 0, 1, 2, or 3; and the sum a+b is 0, 1, 2, or 3; with the proviso that there is on average at least 1 $R^2$ present per molecule.

Organopolysiloxanes that contain aliphatic unsaturation preferably have an average viscosity of at least 5 mPa·s at 25° C.

Examples of suitable $R^1$ groups are alkyl groups such as methyl, ethyl, n-propyl, iso-propyl, n-butyl, iso-butyl, tert-butyl, n-pentyl, iso-pentyl, neo-pentyl, tert-pentyl, cyclopentyl, n-hexyl, cyclohexyl, n-octyl, 2,2,4-trimethylpentyl, n-decyl, n-dodecyl, and n-octadecyl; aromatic groups such as phenyl or naphthyl; alkaryl groups such as 4-tolyl; aralkyl groups such as benzyl, 1-phenylethyl, and 2-phenylethyl; and substituted alkyl groups such as 3,3,3-trifluoro-n-propyl, 1,1, 2,2-tetrahydroperfluoro-n-hexyl, and 3-chloro-n-propyl.

Examples of suitable $R^2$ groups are alkenyl groups such as vinyl, 5-hexenyl, 1-propenyl, allyl, 3-butenyl, 4-pentenyl, 7-octenyl, and 9-decenyl; and alkynyl groups such as ethynyl, propargyl and 1-propynyl. In the present invention, groups having aliphatic carbon-carbon multiple bonds include groups having cycloaliphatic carbon-carbon multiple bonds.

Organopolysiloxanes that contain silicon-bonded hydrogen are preferably linear, cyclic or branched organopolysiloxanes comprising units of the formula $R^1{}_aH_cSiO_{(4-a-c)/2}$ wherein: $R^1$ is as defined above; a is 0, 1, 2, or 3; c is 0, 1, or 2; and the sum of a+c is 0, 1, 2, or 3; with the proviso that there is on average at least 1 silicon-bonded hydrogen atom present per molecule.

Organopolysiloxanes that contain silicon-bonded hydrogen preferably have an average viscosity of at least 5 mPa·s at 25° C.

Organopolysiloxanes that contain both aliphatic unsaturation and silicon-bonded hydrogen preferably comprise units of both formulae $R^1{}_aR^2{}_bSiO_{(4-a-b)/2}$ and $R^1{}_aH_cSiO_{(4-a-c)/2}$. In these formulae, $R^1$, $R^2$, a, b, and c are as defined above, with the proviso that there is an average of at least 1 group containing aliphatic unsaturation and 1 silicon-bonded hydrogen atom per molecule.

The molar ratio of silicon-bonded hydrogen atoms to aliphatic unsaturation in the silicon-containing resin (particularly the organopolysiloxane resin) may range from 0.5 to 10.0 mol/mol, preferably from 0.8 to 4.0 mol/mol, and more preferably from 1.0 to 3.0 mol/mol.

For some embodiments, organopolysiloxane resins described above wherein a significant fraction of the $R^1$ groups are phenyl or other aryl, aralkyl, or alkaryl are preferred, because the incorporation of these groups provides materials having higher refractive indices than materials wherein all of the $R^1$ radicals are, for example, methyl.

The disclosed compositions also include a metal-containing catalyst which enables the cure of the encapulating material via radiation-activated hydrosilylation. These catalysts are known in the art and typically include complexes of precious metals such as platinum, rhodium, iridium, cobalt, nickel, and palladium. The precious metal-containing catalyst preferably contains platinum. Disclosed compositions can also include a cocatalyst.

A variety of such catalysts is disclosed, for example, in U.S. Pat. No. 6,376,569 (Oxman et al.), U.S. Pat. No. 4,916,169 (Boardman et al.), U.S. Pat. No. 6,046,250 (Boardman et al.), U.S. Pat. No. 5,145,886 (Oxman et al.), U.S. Pat. No. 6,150,546 (Butts), U.S. Pat. No. 4,530,879 (Drahnak), U.S. Pat. No. 4,510,094 (Drahnak) U.S. Pat. No. 5,496,961 (Dauth), U.S. Pat. No. 5,523,436 (Dauth), U.S. Pat. No. 4,670,531 (Eckberg), as well as International Publication No. WO 95/025735 (Mignani).

Certain preferred platinum-containing catalysts are selected from the group consisting of Pt(II) β-diketonate complexes (such as those disclosed in U.S. Pat. No. 5,145,886 (Oxman et al.), ($\eta^5$-cyclopentadienyl)tri(σ-aliphatic)platinum complexes (such as those disclosed in U.S. Pat. No. 4,916,169 (Boardman et al.) and U.S. Pat. No. 4,510,094 (Drahnak)), and $C_{7-20}$-aromatic substituted ($\eta^5$-cyclopentadienyl)tri(σ-aliphatic)platinum complexes (such as those disclosed in U.S. Pat. No. 6,150,546 (Butts).

Such catalysts are used in an amount effective to accelerate the hydrosilylation reaction. Such catalysts are preferably included in the encapsulating material in an amount of at least 1 part, and more preferably at least 5 parts, per one million parts of the encapsulating material composition. Such catalysts are preferably included in the encapsulating material in an amount of no greater than 1000 parts of metal, and more preferably no greater than 200 parts of metal, per one million parts of the encapsulating material composition.

In addition to the silicon-containing resins and catalysts, the encapsulating material can also include nonabsorbing metal oxide particles, semiconductor particles, phosphors, sensitizers, photoinitiators, antioxidants, catalyst inhibitors, and pigments. If used, such additives are used in amounts to produced the desired effect.

Particles that are included within the encapsulating material can be surface treated to improve dispersibility of the particles in the resin. Examples of such surface treatment chemistries include silanes, siloxanes, carboxylic acids, phosphonic acids, zirconates, titanates, and the like. Techniques for applying such surface treatment chemistries are known.

Nonabsorbing metal oxide and semiconductor particles can optionally be included in the encapsulating material to increase the refractive index of the encapsulant. Suitable nonabsorbing particles are those that are substantially transparent over the emission bandwidth of the LED. Examples of nonabsorbing metal oxide and semiconductor particles include, but are not limited to, $A_2O_3$, $ZrO_2$, $TiO_2$, $V_2O_5$, $ZnO$, $SnO_2$, $ZnS$, $SiO_2$, and mixtures thereof, as well as other sufficiently transparent non-oxide ceramic materials such as semiconductor materials including such materials as ZnS, CdS, and GaN. Silica ($SiO_2$), having a relatively low refractive index, may also be useful as a particle material in some applications, but, more significantly, it can also be useful as a thin surface treatment for particles made of higher refractive index materials, to allow for more facile surface treatment with organosilanes. In this regard, the particles can include species that have a core of one material on which is deposited a material of another type. If used, such nonabsorbing metal oxide and semiconductor particles are preferably included in the encapsulating material in an amount of no greater than 85 wt-%, based on the total weight of the encapsulating material. Preferably, the nonabsorbing metal oxide and semiconductor particles are included in the encapsulating material in an amount of at least 10 wt-%, and more preferably in an amount of at least 45 wt-%, based on the total weight of the encapsulating material. Generally the particles can range in size from 1 nanometer to 1 micron, preferably from 10 nanometers to 300 nanometers, more preferably, from 10 nanometers to 100 nanometers. This particle size is an average particle size, wherein the particle size is the longest dimension of the particles, which is a diameter for spherical particles. It will be appreciated by those skilled in the art that the volume percent of metal oxide and/or semiconductor particles cannot exceed 74 percent by volume given a monomodal distribution of spherical particles.

Phosphors can optionally be included in the encapsulating material to adjust the color emitted from the LED. As described herein, a phosphor consists of a fluorescent material. The fluorescent material could be inorganic particles, organic particles, or organic molecules or a combination thereof. Suitable inorganic particles include doped garnets (such as YAG:Ce and (Y,Gd)AG:Ce), aluminates (such as $Sr_2Al_{14}O_{25}$:Eu, and BAM:Eu), silicates (such as SrBaSiO:Eu), sulfides (such as ZnS:Ag, CaS:Eu, and $SrGa_2S_4$:Eu), oxy-sulfides, oxy-nitrides, phosphates, borates, and tungstates (such as $CaWO_4$). These materials may be in the form of conventional phosphor powders or nanoparticle phosphor powders. Another class of suitable inorganic particles is the so-called quantum dot phosphors made of semiconductor nanoparticles including Si, Ge, CdS, CdSe, CdTe, ZnS, ZnSe, ZnTe, PbS, PbSe, PbTe, InN, InP, InAs, AlN, AlP, AlAs, GaN, GaP, GaAs and combinations thereof. Generally, the surface of each quantum dot will be at least partially coated with an organic molecule to prevent agglomeration and increase compatibility with the binder. In some cases the semiconductor quantum dot may be made up of several layers of different materials in a core-shell construction. Suitable organic molecules include fluorescent dyes such as those listed in U.S. Pat. No. 6,600,175 (Baretz et al.). Preferred fluorescent materials are those that exhibit good durability and stable optical properties. The phosphor layer may consist of a blend of different types of phosphors in a single layer or a series of layers, each containing one or more types of phosphors. The inorganic phosphor particles in the phosphor layer may vary in size (e.g., diameter) and they may be segregated such that the average particle size is not uniform across the cross-section of the siloxane layer in which they are incorporated. If used, the phosphor particles are preferably included in the encapsulating material in an amount of no greater than 85 wt-%, and in an amount of at least 1 wt-%, based on the total weight of the encapsulating material. The amount of phosphor used will be adjusted according to the thickness of the siloxane layer containing the phosphor and the desired color of the emitted light.

Sensitizers can optionally be included in the encapsulating material to both increase the overall rate of the curing process (or hydrosilylation reaction) at a given wavelength of initiating radiation and/or shift the optimum effective wavelength of the initiating radiation to longer values. Useful sensitizers include, for example, polycyclic aromatic compounds and aromatic compounds containing a ketone chromaphore (such as those disclosed in U.S. Pat. No. 4,916,169 (Boardman et al.) and U.S. Pat. No. 6,376,569 (Oxman et al.)). Examples of useful sensitizers include, but are not limited to, 2-chlorothioxanthone, 9,10-dimethylanthracene, 9,10-dichloroanthracene, and 2-ethyl-9,10-dimethylanthracene. If used, such sensitizers are preferably included in the encapsulating material in an amount of no greater than 50,000 parts by weight, and more preferably no greater than 5000 parts by weight, per one million parts of the composition. If used, such sensitizers are preferably included in the encapsulating material in an amount of at least 50 parts by weight, and more preferably at least 100 parts by weight, per one million parts of the composition.

Photoinitiators can optionally be included in the encapsulating material to increase the overall rate of the curing process (or hydrosilylation reaction). Useful photoinitiators include, for example, monoketals of α-diketones or α-ketoaldehydes and acyloins and their corresponding ethers (such as those disclosed in U.S. Pat. No. 6,376,569 (Oxman et al.)). If used, such photoinitiators are preferably included in the encapsulating material in an amount of no greater than 50,000 parts by weight, and more preferably no greater than 5000 parts by weight, per one million parts of the composition. If used, such photoinitiators are preferably included in the encapsulating material in an amount of at least 50 parts by weight, and more preferably at least 100 parts by weight, per one million parts of the composition.

Catalyst inhibitors can optionally be included in the encapsulating material to further extend the usable shelf life of the composition. Catalyst inhibitors are known in the art and include such materials as acetylenic alcohols (for example, see U.S. Pat. No. 3,989,666 (Niemi) and U.S. Pat. No. 3,445,420 (Kookootsedes et al.)), unsaturated carboxylic esters (for example, see U.S. Pat. No. 4,504,645 (Melancon), U.S. Pat. No. 4,256,870 (Eckberg), U.S. Pat. No. 4,347,346 (Eckberg), and U.S. Pat. No. 4,774,11 1(Lo)) and certain olefinic siloxanes (for example, see U.S. Pat. No. 3,933,880 (Bergstrom), U.S. Pat. No. 3,989,666 (Niemi), and U.S. Pat. No. 3,989,667 (Lee et al.). If used, such catalyst inhibitors are preferably included in the encapsulating material in an amount not to exceed the amount of the metal-containing catalyst on a mole basis.

LEDs

The silicon-containing materials described herein are useful as encapsulants for light emitting devices that include an LED. LED in this regard refers to a diode that emits light, whether visible, ultraviolet, or infrared. It includes incoherent epoxy-encased semiconductor devices marketed as "LEDs", whether of the conventional or super-radiant variety. Vertical cavity surface emitting laser diodes are another form of LED. An "LED die" is an LED in its most basic form, i.e., in the form of an individual component or chip made by semiconductor wafer processing procedures. The component or chip can include electrical contacts suitable for application of power to energize the device. The individual layers and other functional elements of the component or chip are typically formed on the wafer scale, the finished wafer finally being diced into individual piece parts to yield a multiplicity of LED dies.

The silicon-containing materials described herein are useful with a wide variety of LEDs, including monochrome and phosphor-LEDs (in which blue or UV light is converted to another color via a fluorescent phosphor). They are also useful for encapsulating LEDs packaged in a variety of configurations, including but not limited to LEDs surface mounted in ceramic or polymeric packages, which may or may not have a reflecting cup, LEDs mounted on circuit boards, and LEDs mounted on plastic electronic substrates.

LED emission light can be any light that an LED source can emit and can range from the UV to the infrared portions of the electromagnetic spectrum depending on the composition and structure of the semiconductor layers. Where the source of the actinic radiation is the LED itself, LED emission is preferably in the range from 350-500 nm. The silicon-containing materials described herein are particularly useful in surface mount and side mount LED packages where the encapsulant is cured in a reflector cup. They are also particularly useful with LED designs containing a top wire bond (as opposed to flip-chip configurations). Additionally, the silicon containing materials can be useful for surface mount LEDs where there is no reflector cup and can be useful for encapsulating arrays of surface mounted LEDs attached to a variety of substrates.

The silicon-containing materials described herein are resistant to thermal and photodegradation (resistant to yellowing) and thus are particularly useful for white light sources (i.e., white light emitting devices). White light sources that utilize LEDs in their construction can have two basic configurations. In one, referred to herein as direct emissive LEDs, white light is generated by direct emission of different colored LEDs. Examples include a combination of a red LED, a green LED, and a blue LED, and a combination of a blue LED and a yellow LED. In the other basic configuration, referred to herein as LED-excited phosphor-based light sources (PLEDs), a single LED generates light in a narrow range of wavelengths, which impinges upon and excites a phosphor material to produce visible light. The phosphor can comprise a mixture or combination of distinct phosphor materials, and the light emitted by the phosphor can include a plurality of narrow emission lines distributed over the visible wavelength range such that the emitted light appears substantially white to the unaided human eye.

An example of a PLED is a blue LED illuminating a phosphor that converts blue to both red and green wavelengths. A portion of the blue excitation light is not absorbed by the phosphor, and the residual blue excitation light is combined with the red and green light emitted by the phosphor. Another example of a PLED is an ultraviolet (UV) LED illuminating a phosphor that absorbs and converts UV light to red, green, and blue light. Organopolysiloxanes where the $R^1$ groups are small and have minimal UV absorption, for example methyl, are preferred for UV light emitting diodes. It will be apparent to one skilled in the art that competitive absorption of the actinic radiation by the phosphor will decrease absorption by the photoinitiators slowing or even preventing cure if the system is not carefully constructed.

EXAMPLES

Mounting Blue LED Die in a Ceramic Package

Into a Kyocera package (Kyocera America, Inc., Part No. KD-LA2707-A) was bonded a Cree XB die (Cree Inc., Part No. C460XB290-0103-A) using a water based halide flux (Superior No. 30, Superior Flux & Mfg. Co.). The LED device was completed by wire bonding (Kulicke and Soffa Industries, Inc. 4524 Digital Series Manual Wire Bonder) the Cree XB die using 1 mil gold wire. Prior to encapsulation, each device was tested using a OL 770 Spectroradiometer (Optronics Laboratories, Inc.) with a constant current of 20 mA. The peak emission wavelength of the LED was 455-457 nm.

Preparation of Organopolysiloxane

The organopolysiloxane $H_2C$=CH—Si$(CH_3)_2$O—[Si$(CH_3)_2$O]$_{100}$—Si$(CH_3)_2$—CH=CH$_2$ was prepared as follows. In a half-gallon polyethylene bottle were combined 1000.0 g (3.371 mol) of octamethylcyclotetrasiloxane (Gelest, Inc.), 25.1 g (0.135 mol) of 1,3-divinyl-1,1,3,3,-tetramethyldisiloxane (Gelest, Inc.), 1.0 g of concentrated sulfuric acid, and 5.0 g of activated carbon. The mixture was agitated at room temperature for 24 hours and filtered. Volatiles were separated from the filtrate at 200° C. using a thin film evaporator to give 870.0 g of a clear, colorless fluid. The $^1$H and $^{29}$Si NMR spectra of the product were consistent with the structure of the desired organopolysiloxane.

Example 1

Visible Light Cure

A mixture of siloxanes consisting of 10.00 g (olefin meq wt=3.801 g) of the organopolysiloxane prepared as described in the previous paragraph and 0.44 g (Si—H meq wt=0.111 g) of $(CH_3)_3$SiO—[Si$(CH_3)_2$O]$_{15}$—[SiH$(CH_3)$O]$_{25}$—Si$(CH_3)_3$ (Dow Corning Corp., SYL-OFF® 7678) was prepared in a 35 mL amber bottle. A catalyst stock solution was prepared by dissolving 22.1 mg of Pt(acac)$_2$ (wherein acac is acetoacetonate, purchased from Aldrich Chemical Co.) in 1.00 mL of $CH_2Cl_2$. A 100 µL aliquot of this catalyst stock solution was added to the mixture of siloxanes. The final formulation was equivalent to a ratio of aliphatic unsaturation to silicon-bonded hydrogen of 1.5 and contained approximately 100 ppm of platinum.

Into the blue LED device described above was placed approximately 2 mg of the final formulation described above. The LED was illuminated for 2.5 minutes at 20 mA. The encapsulated device was allowed to sit for an additional 5 minutes. The encapsulant was elastomeric and cured as determined by probing with the tip of a tweezer. The efficiency of the resulting encapsulated LED device was measured using an OL 770 spectroradiometer and increased from 9.3% before encapsulation to 11.8% after encapsulation.

Example 2

UV Light Cure

An encapsulated LED device was prepared and evaluated in the same manner as described in Example 1 except that 21.1 mg of CpPt$(CH_3)_3$, prepared as described in Boardman et al., *Magn. Reson. Chem.*, 30, 481 (1992), was used instead of 22.1 mg of Pt(acac)$_2$, and illumination was carried out using a UV lamp at 365 nm. Efficiency increased from 8.9% before encapsulation to 11.6% after encapsulation.

Further Embodiments

Examples 3-6 illustrate further embodiments of the invention that can be made.

Example 3

Visible Light Cure

A mixture of siloxanes consisting of 10.00 g (olefin meq wt=1.46 g) of the vinyl siloxane base polymer $H_2C$=CH—Si$(CH_3)_2$O—[Si$(CH_3)(C_6H_5)$O]$_n$—Si$(CH_3)_2$—CH=CH$_2$ (Gelest, Inc., PMV-9925) and 1.64 g (Si—H meq wt=0.16 g) of the siloxane crosslinking agent H$(CH_3)_2$SiO—[SiH$(CH_3)$O]$_m$—[Si$(CH_3)(C_6H_5)$O]$_n$—Si$(CH_3)_2$H (Gelest, Inc., HPM-502) is prepared in a 35 mL amber bottle. A 100 µL aliquot of a Pt(acac)$_2$ solution in $CH_2Cl_2$ prepared as described in Example 1 is added to the mixture of siloxanes. The final formulation is equivalent to a ratio of aliphatic unsaturation to silicon-bonded hydrogen of 1.5 and contains approximately 100 ppm of platinum.

Into the blue LED device described above is placed approximately 2 mg of the above final formulation. The LED device is illuminated for 2.5 minutes at 20 mA and then allowed to sit for an additional 5 minutes. The encapsulant is elastomeric and cured as determined by probing with the tip of a tweezer.

Example 4

UV Light Cure

An encapsulated LED device is prepared and evaluated in the same manner as described in Example 3 except that 21.1 mg of CpPt$(CH_3)_3$ is used instead of 22.1 mg of Pt(acac)$_2$, and illumination is carried out using a UV lamp at 365 nm. The encapsulant is elastomeric and cured as determined by probing with the tip of a tweezer.

Example 5

Visible Light Cure

A mixture of siloxanes consisting of 10.00 g (olefin meq wt=1.24 g) of the vinyl silsesquioxane base polymer [$H_2C$=CH—SiO$_{3/2}$]$_m$—[Si$(C_6H_5)$O$_{3/2}$]$_n$ (where m and n represent 10 and 90 mole percent, respectively, of the monomer units in the silsesquioxane; Gelest, Inc., SST-3PV1) and 1.92 g (Si—H meq wt=0.16 g) of the siloxane crosslinking agent H$(CH_3)_2$SiO—[Si$(C_6H_5)$[OSi$(CH_3)_2$H]O]$_n$—Si$(CH_3)_2$ H (Gelest, Inc., HDP-111) is prepared in a 35 mL amber bottle. A 100 µL aliquot of a Pt(acac)$_2$ solution in $CH_2Cl_2$ prepared as described in Example 1 is added to the mixture of siloxanes. The final formulation is equivalent to a ratio of aliphatic unsaturation to silicon-bonded hydrogen of 1.5 and contains approximately 100 ppm of platinum.

Into the blue LED device described above is placed approximately 2 mg of the above final formulation. The LED is illuminated for 2.5 minutes at 20 mA and then allowed to sit for an additional 5 minutes. The encapsulant is elastomeric and cured as determined by probing with the tip of a tweezer.

Example 6

UV Light Cure

An encapsulated LED device is prepared and evaluated in the same manner as described in Example 5 except that 21.1 mg of CpPt(CH$_3$)$_3$ is used instead of 22.1 mg of Pt(acac)$_2$, and illumination is carried out using a UV lamp at 365 nm. The encapsulant is elastomeric and cured as determined by probing with the tip of a tweezer.

The complete disclosures of the patents, patent documents, and publications cited herein are incorporated by reference in their entirety as if each were individually incorporated. Various modifications and alterations to the invention will become apparent to those skilled in the art without departing from the scope and spirit of the invention. It should be understood that the invention is not intended to be unduly limited by the illustrative embodiments and examples set forth herein, and that such examples and embodiments are presented by way of example only with the scope of the invention intended to be limited only by the claims set forth herein as follows.

What is claimed is:

1. A method of making a light emitting device, the method comprising:
   providing a light emitting diode; and
   forming an encapsulant in contact with the light emitting diode, wherein forming the encapsulant comprises:
      contacting the light emitting diode with a photopolymerizable composition comprising a silicon-containing resin, a metal-containing catalyst, and surface treated particles, the silicon-containing resin comprises silicon-bonded hydrogen and aliphatic unsaturation, the surface treated particles comprising nonabsorbing metal oxide particles, semiconductor particles, or combinations thereof; and
      applying actinic radiation having a wavelength of 700 nm or less to initiate hydrosilylation within the silicon-containing resin.

2. The method of claim 1, the nonabsorbing metal oxide particles comprising Al$_2$O$_3$, ZrO$_2$, TiO$_2$, V$_2$O$_5$, ZnO, SnO$_2$, ZnS, SiO$_2$, or mixtures thereof.

3. The method of claim 1, the semiconductor particles comprising ZnS, CdS or GaN.

4. The method of claim 1, the surface treated particles comprising a thin surface treatment of SiO$_2$.

5. The method of claim 1, the surface treated particles present in an amount of at least 45 wt-%, based on the total weight of the encapsulant.

6. The method of claim 1, the surface treated particles having an average particle size of from 10 nanometers to 100 nanometers.

7. The method of claim 1 wherein the silicon-bonded hydrogen and the aliphatic unsaturation are present in the same molecule.

8. The method of claim 1 wherein the silicon-bonded hydrogen and the aliphatic unsaturation are present in different molecules.

9. The method of claim 1 wherein at least 60 mole percent of the aliphatic unsaturation is consumed in a hydrosilylation reaction.

10. The method of claim 1 wherein applying actinic radiation comprises applying actinic radiation at a temperature of less than 60° C.

11. The method of claim 1 wherein the metal-containing catalyst comprises platinum.

12. The method of claim 11 wherein the metal-containing catalyst is selected from the group consisting of Pt(II) β-diketonate complexes, (η$^5$-cyclopentadienyl)tri(σ-aliphatic) platinum complexes, and C$_{7\text{-}20}$-aromatic substituted (η$^5$-cyclopentadienyl)tri(σ-aliphatic)platinum complexes.

13. The method of claim 1 wherein the silicon containing resin comprises an organosiloxane comprising units of the formula:

$$R^1_a R^2_b SiO_{(4-a-b)/2}$$

wherein:
   R$^1$ is a monovalent, straight-chained, branched or cyclic, unsubstituted or substituted, hydrocarbon group that is free of aliphatic unsaturation and has from 1 to 18 carbon atoms;
   R$^2$ is a monovalent hydrocarbon group having aliphatic unsaturation and from 2 to 10 carbon atoms;
   a is 0, 1, 2, or 3;
   b is 0, 1, 2, or 3; and
   the sum a+b is 0, 1, 2, or 3;
   with the proviso that there is on average at least one R$^2$ present per molecule.

14. The method of claim 1 wherein the silicon containing resin comprises an organosiloxane comprising units of the formula:

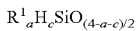

$$R^1_a H_c SiO_{(4-a-c)/2}$$

wherein:
   R$^1$ is a monovalent, straight-chained, branched or cyclic, unsubstituted or substituted, hydrocarbon group that is free of aliphatic unsaturation and has from 1 to 18 carbon atoms;
   a is 0, 1, 2, or 3;
   c is 0, 1, or 2; and
   the sum of a+c is 0, 1, 2, or 3;
   with the proviso that there is on average at least one silicon-bonded hydrogen present per molecule.

15. The method of claim 1 wherein the silicon-bonded hydrogen and the aliphatic unsaturation are present in a molar ratio of from 1.0 to 3.0.

16. The method of claim 1 wherein the photopolymerizable material comprises one or more additives selected from the group consisting of phosphors, sensitizers, antioxidants, pigments, photoinitiators, catalyst inhibitors, and combinations thereof.

17. The method of claim 1 wherein the surface treated particles comprise particles surface treated with silanes, siloxanes, carboxylic acids, phosphonic acids, zirconates, or titanates.

18. A light emitting device prepared using the method of claim 1.

* * * * *